United States Patent
Hirabayashi et al.

(10) Patent No.: US 11,215,514 B2
(45) Date of Patent: Jan. 4, 2022

(54) ELECTRONIC COMPONENT FOR WELDING, MOUNTED BOARD AND TEMPERATURE SENSOR

(71) Applicant: SEMITEC Corporation, Tokyo (JP)

(72) Inventors: Takaaki Hirabayashi, Tokyo (JP); Dezhi Cheng, Tokyo (JP)

(73) Assignee: SEMITEC Corporation, Tokyo (JP)

( * ) Notice: Subject to any disclaimer, the term of this patent is extended or adjusted under 35 U.S.C. 154(b) by 308 days.

(21) Appl. No.: 16/338,699

(22) PCT Filed: Sep. 29, 2017

(86) PCT No.: PCT/JP2017/035493
§ 371 (c)(1),
(2) Date: Apr. 2, 2019

(87) PCT Pub. No.: WO2018/066473
PCT Pub. Date: Apr. 12, 2018

(65) Prior Publication Data
US 2021/0181036 A1  Jun. 17, 2021

(30) Foreign Application Priority Data
Oct. 7, 2016 (JP) .............................. JP2016-199571

(51) Int. Cl.
*G01K 7/22* (2006.01)
*G01K 7/18* (2006.01)
(Continued)

(52) U.S. Cl.
CPC ............. *G01K 7/223* (2013.01); *G01K 7/183* (2013.01); *H01C 1/1406* (2013.01);
(Continued)

(58) Field of Classification Search
CPC .... H01C 1/1406; H01C 1/1413; H01G 4/228; H05K 1/18
See application file for complete search history.

(56) References Cited

U.S. PATENT DOCUMENTS 3,434,940 A * 3/1969 Brown ................... G01K 7/183
                                                          205/122
3,886,578 A * 5/1975 Eastwood ............... H01L 23/15
                                                          257/43
(Continued)

FOREIGN PATENT DOCUMENTS

| CN | 1367497 | 9/2002 |
| JP | S5029253 | 4/1975 |

(Continued)

OTHER PUBLICATIONS

"International Search Report (Form PCT/ISA/210) of PCT/JP2017/035493," dated Dec. 19, 2017, with English translation thereof, pp. 1-4.

(Continued)

*Primary Examiner* — Kyung S Lee
(74) *Attorney, Agent, or Firm* — JCIPRNET

(57) ABSTRACT

The present invention enables the achievement of: high density mounting by means of an electronic component for welding; and improvement of thermal responsivity and tensile strength at high temperatures by means of reduction in size and thickness of a temperature sensor. An electronic component for welding, which has a function of a resistor, a capacitor, an inductor or the like, comprises: an insulating substrate; a function part and a bonding electrode part, which are provided on the insulating substrate; and a lead which is electrically connected to the bonding electrode part. The bonding electrode part is configured of: an adhesive active metal layer which is formed from a high-melting-point metal on the insulating substrate; a barrier layer which (Continued)

is formed from a high-melting-point metal on the active metal layer; and a bonding metal layer which is mainly composed of a low-melting-point metal and is formed on the barrier layer.

21 Claims, 10 Drawing Sheets

(51) Int. Cl.
*H01C 1/14* (2006.01)
*H01C 17/28* (2006.01)
*H01G 4/228* (2006.01)
*H05K 1/18* (2006.01)

(52) U.S. Cl.
CPC ........... *H01C 1/1413* (2013.01); *H01C 17/28* (2013.01); *H01G 4/228* (2013.01); *H05K 1/18* (2013.01)

(56) References Cited

U.S. PATENT DOCUMENTS

| | | | | | |
|---|---|---|---|---|---|
| 3,936,790 | A | * | 2/1976 | Eastwood | H01C 7/047 338/25 |
| 4,020,443 | A | * | 4/1977 | LeRoy | G01K 1/18 338/28 |
| 4,129,848 | A | * | 12/1978 | Frank | G01F 23/247 204/192.23 |
| 5,294,910 | A | * | 3/1994 | Tani | H01C 1/142 338/25 |
| 6,189,767 | B1 | * | 2/2001 | Haspeslagh | H01C 1/14 228/123.1 |
| 2002/0101327 | A1 | * | 8/2002 | Lavenuta | H04L 67/025 338/22 R |
| 2011/0285498 | A1 | * | 11/2011 | Yoneda | H01C 1/144 338/306 |
| 2013/0199826 | A1 | * | 8/2013 | Britton | H01G 2/10 174/251 |

FOREIGN PATENT DOCUMENTS

| | | |
|---|---|---|
| JP | H02269924 | 11/1990 |
| JP | 2000074752 | 3/2000 |
| JP | 2006049620 | 2/2006 |
| JP | 2008241566 | 10/2008 |
| JP | 2010197163 | 9/2010 |
| JP | 2012004538 | 1/2012 |
| JP | 2013008918 | 1/2013 |
| JP | 2013187322 | 9/2013 |
| JP | 2013197367 | 9/2013 |
| JP | 2013539908 | 10/2013 |
| JP | 2014092428 | 5/2014 |
| JP | 2014116456 | 6/2014 |
| JP | 5663804 | 2/2015 |
| JP | 2015053350 | 3/2015 |
| WO | 2016035818 | 3/2016 |

OTHER PUBLICATIONS

Office Action of China Counterpart Application, with English translation thereof, dated Oct. 9, 2020, pp. 1-16.
"Office Action of China Counterpart Application" with English translation thereof, dated May 24, 2021, p. 1-p. 15.
"Office Action of China Counterpart Application" with English translation thereof, dated Aug. 27, 2021, p. 1-p. 14.
"Office Action of Korea Counterpart Application" with English translation thereof, dated Sep. 6, 2021, p. 1-p. 11.

* cited by examiner

ELECTRONIC COMPONENT FOR WELDING, MOUNTED BOARD AND TEMPERATURE SENSOR

CROSS-REFERENCE TO RELATED APPLICATION

This application is a 371 application of International PCT application serial no. PCT/JP2017/035493, filed on Sep. 29, 2017, which claims the priority benefit of Japan application no. 2016-199571, filed on Oct. 7, 2016. The entirety of each of the abovementioned patent applications is hereby incorporated by reference herein and made a part of this specification.

TECHNICAL FIELD

The disclosure relates to an electronic component for welding such as a resistor, a capacitor, an inductor, and the like which has a predetermined function and can be mounted by welding, and a mounted board on which the electronic component for welding is mounted.

Further, the disclosure relates to a temperature sensor which performs temperature detection in response to an object temperature, an ambient temperature, thermal radiation and the like using a temperature characteristic of a function of an electronic component for welding, particularly to a temperature sensor in which a lead (a lead wire or a wiring pattern) is welded to an electronic component for welding having a heat sensing part provided on an ultrathin insulating substrate as a function part.

BACKGROUND ART

An electronic component having a function part formed as a thin film or a thick film on an ultrathin insulating substrate is known, and for example, a resistor having a resistance film as a function part is known. Such a resistor is applied as a temperature sensor such as a thermistor or a platinum temperature measuring resistor using, for example, a temperature characteristic of a resistance value. In general, the thermistor has a negative characteristic, but recently, a positive characteristic thermistor has also been introduced.

However, a general resistor includes a function part as a plate-like or flake-like resistance film having a heat sensing characteristic, a pair of electrode parts for measuring a resistance value of the function part, and a pair of leads connected to the electrode parts. The resistor formed on the above-described ultrathin insulating substrate has a remarkably small thickness and heat capacity, compared with such a general resistor, and is thus suitable for reduction in size and thickness and temperature measurement of high speed thermal responsiveness.

Generally, in an electronic component such as a resistor formed on an ultrathin insulating substrate, a resistance film and an electrode film which are functional films are formed on the insulating substrate by a thin film technique or a thick film technique and are formed to have predetermined film thicknesses and patterns using a micro-fabrication technique such as a photolithography technology. Typically, a resistance film is formed at a central portion on an insulating substrate such as a ceramic substrate to have a predetermined film thickness and pattern, and a pair of electrode films are formed in a predetermined film thickness and pattern on a peripheral part of the insulating substrate to face each other with the resistance film interposed therebetween.

In such a resistor, a temperature sensor in which leads for detection (lead lines or wiring patterns) are bonded to the electrode film formed around the resistance film on the insulating substrate is known. Conventionally, soldering has been widely used for bonding this type of lead and electrode film. However, since a solder has a low melting point, an operating temperature of the resistor is limited to 150° C. or less, and also since a thickness of a solder bonded part is several tens of μm, it is difficult to reduce a thickness and to improve thermal responsiveness. Further, even when a bonding material such as a conductive paste is used instead of soldering, since tensile strength is insufficient by itself, reinforcement with a technique such as glass sealing is required, and thus it is still difficult to reduce the size and the thickness and to improve the thermal responsiveness (refer to, for example, Patent Literature 1).

The performance and reliability required for today's resistors are becoming more severe in accordance with specifications of their use and applications. In particular, further improvement in thermal responsiveness is required as a point to improve the performance, which equates to a requirement for reduction in heat capacity, that is, reduction in size and thickness by providing an ultrathin bonding layer on an ultrathin insulating substrate. Further, due to restrictions on usage environment of the application, for example, restrictions on a size or an operation of various devices or members incorporating the resistors, cases in which the resistors are required to be more compact and thinner and to improve the tensile strength (mounting strength) are increasing. Under these circumstances, recently, an application of laser welding technology to lead bonding in the resistor has been actively studied for the purpose of improving heat resistance (refer to, for example, Patent Literatures 2 and 3). However, in these techniques, a plating layer or a bump layer of several tens of μm to hundreds of μm is required for a bonding electrode part, reinforcement with a technique such as glass sealing is required due to insufficient strength, and thus it is still difficult to reduce the size and thickness and to improve the thermal responsiveness.

In the case of board built-in mounting, as disclosed in Patent Literature 4, one using a laser technology for via hole formation is known, and a plating technique which requires a complicated process is used for wiring to an electronic component with a via hole interposed. In addition to a resistor as disclosed in Patent Literature 4, application examples to a capacitor of Patent Literature 5 and an inductor of Patent Literature 6 are known as a technique for forming a plating wiring in a via hole formed by such a laser technology.

CITATION LIST

Patent Literature

[Patent Literature 1] Japanese Patent Laid-Open No. 2000-074752
[Patent Literature 2] Japanese Patent Laid-Open No. 2008-241566
[Patent Literature 3] Japanese Patent Laid-Open No. 2010-197163
[Patent Literature 4] Japanese Patent No. 5663804
[Patent Literature 5] Japanese Patent Laid-Open No. 2015-53350
[Patent Literature 6] PCT International Publication No. WO2016/035818

SUMMARY OF INVENTION

Technical Problem

However, even though a welding technique is used for bonding the electrode film and the lead in an electronic component for welding formed on the insulating substrate and mainly having temperature sensing performance, in reality, it is impossible to sufficiently solve conventional problems (the thermal responsiveness, the reduction in size and thickness, the tensile strength and the heat resistance) with the above-described conventional techniques.

On the other hand, in the in-board mounting, as described above, the laser technology is used for via hole formation, but a complicated process is still necessary for the wiring process to the electronic component with the via hole interposed. Further, in the in-board mounting, the wiring to the electronic component with the via hole interposed is formed by plating which requires a complicated process, such a plating wiring increases a mounting thickness, and there is also a problem that high density mounting cannot be performed.

For the purpose of avoiding a thermal influence from a place in which the lead terminates, a conventional electronic component with the temperature sensing performance, mainly a resistor, is used as a temperature sensor using an electric wire or a conductive plate formed of an iron-based metal having low thermal conductivity, such as Dumet, SUS, 42 alloy or Kovar, for leads (refer to, for example, Patent Literatures 2 and 3). However, the iron-based metals have a high melting point, for example, melting points of Dumet, SUS and Kovar are 1420° C. to 1450° C. When a laser beam for laser welding is radiated to such a lead formed of a high melting point metal, the lead and surroundings thereof are heated to a temperature higher than a lead melting point and may locally exceed 2000° C., and thus the insulating substrate (for example, an alumina substrate) melts and is easily damaged. When damage to the insulating substrate is large, the temperature sensor itself becomes a defective product. Alternatively, even when the insulating substrate is less damaged and does not become a defective product, there is a possibility of the damaged part becoming a breaking point and the tensile strength greatly decreasing.

Accordingly, in the conventional resistor, a thickness of an electrode film surface layer part (a gold bump, a Ni plating layer, and the like) welded and bonded to the lead is increased to about 30 μm to 100 μm so that a penetration part of the welding is separated upward from the insulating substrate and the thermal influence on the insulating substrate is alleviated. However, nevertheless, a thickness of a bonding part only increases, and damage to the insulating substrate cannot be reliably prevented. Therefore, in order to ensure practical strength as a temperature sensor, a thick film glass reinforcing material which covers the lead bonding part is used while the laser welding is applied to the lead bonding. Also, there is a problem that the thermal responsiveness deteriorates due to a thickness of these bonding part structures.

The present invention has been made in view of the problems of the prior art as described above, and an objective thereof is to provide an electronic component for welding which is capable of efficiently realizing improvement in tensile strength and heat resistance by not causing thermal damage to an insulating substrate while reducing a thickness, simplifying an assembly process when mounted in a board and being mounted with high reliability and high density, a mounted board on which the electronic component for welding is mounted, and a temperature sensor having more excellent thermal responsiveness.

Solution to Problem

An electronic component for welding described in claim 1 includes:
an insulating substrate,
a function part formed on the insulating substrate,
a protective part formed on the function part, and
at least a pair of bonding electrode parts electrically connected to the function part,
wherein the bonding electrode part includes at least an active layer formed on the insulating substrate and including a high melting point metal as a main component, a barrier layer formed on the active layer and including a high melting point metal as a main component, and a bonding layer formed on the barrier layer and including a low melting point metal as a main component.

In an electronic component described in claim 2, the function part may have at least one function of a resistor, a capacitor, and an inductor.

An electronic component described in claim 3 may further include an electrode film formed on the insulating substrate to be interposed between the function part and the bonding electrode part.

In an electronic component described in claim 4, the electrode film may be formed on a film, under a film, or in a film of the function part formed in a film shape.

In an electronic component described in claim 5, a thickness of the bonding electrode part may be 1 μm or less.

In an electronic component described in claim 6, a bending strength of the insulating substrate may be 690 MPa or more, and a thickness thereof may be 100 μm or less.

In an electronic component described in claim 7, a melting point of the high melting point metal of the active layer and the barrier layer may be 1300° C. or more, and a melting point of the low melting point metal may be lower than 1300° C.

In an electronic component described in claim 8, the melting point of the high melting point metal of the active layer and the barrier layer may be 1400° C. or more.

In an electronic component described in claim 9, the active layer may include at least one of titanium, chromium, zirconium, tungsten, molybdenum, manganese, cobalt, nickel, and tantalum as a main component.

In an electronic component described in claim 10, the barrier layer may include at least one of platinum, vanadium, hafnium, rhodium, ruthenium, rhenium, tungsten, molybdenum, nickel, and tantalum as a main component.

In an electronic component described in claim 11, the low melting point metal may include at least one of gold, silver, and copper as a main component.

In a mounted board described in claim 12, the electronic component for welding may be mounted by welding.

A mounted board described in claim 13 may be a multi-layer board with a built-in component.

A mounted board described in claim 14 may be a flexible board.

A temperature sensor described in claim 15 includes the electronic component for welding according to any one of claims 1 to 11, and a lead bonded to the pair of bonding electrode parts, wherein the function part is configured as a heat sensing film of which a function value varies on the basis of temperature, and the lead has a low melting point metal as a main component.

In a temperature sensor described in claim 16, a fusing part of the lead and a melting part of the bonding layer may be melt-bonded.

In a temperature sensor described in claim 17, the lead and the bonding layer may be diffusion-bonded.

In a temperature sensor described in claim 18, the lead may be formed in a thin plate shape or a foil shape.

In a temperature sensor described in claim 19, the lead may include copper as a main component.

In a temperature sensor described in claim 20, the lead may include any one of phosphor bronze, beryllium copper, brass, white copper, nickel silver, constantan, a copper silver alloy, a copper iron alloy, and a copper gold alloy.

In a temperature sensor described in claim 21, the lead may be bonded to the bonding layer via a welding part of the bonding layer, and a bonded part of the lead may be exposed to the outside.

In a temperature sensor described in claim 22, the lead may be an insulating coated lead wire.

Effects of Invention

Due to the above-described configuration, in the electronic component for welding and the temperature sensor according to the present invention, the thermal responsiveness can be improved by reducing the thickness of the bonding electrode part, the improvement of the tensile strength can be efficiently realized by not causing thermal damage to the insulating substrate and can improve the reliability, and also since a reinforcing material of glass is not used, the thickness of the temperature sensor becomes thin and the responsiveness can be improved. Further, high heat resistance can be provided by welding the bonding part. When the electronic component for welding and the temperature sensor are mounted in a board, electrical connection becomes possible by laser welding, an assembly process is simplified, and thus mounting can be realized with high reliability and high density.

DESCRIPTION OF EMBODIMENTS

Hereinafter, preferred embodiments of the present invention will be described with reference to the accompanying drawings. In the following description, an electronic component 10 for welding which is a resistor having a resistance film having a predetermined resistance value as a function part 14 will be described as an example of an electronic component for welding according to the present invention, and the content of the present invention can be widely applied to other electronic components including a capacitor, an inductor and the like within the scope of common technical ideas.

Figure 1:
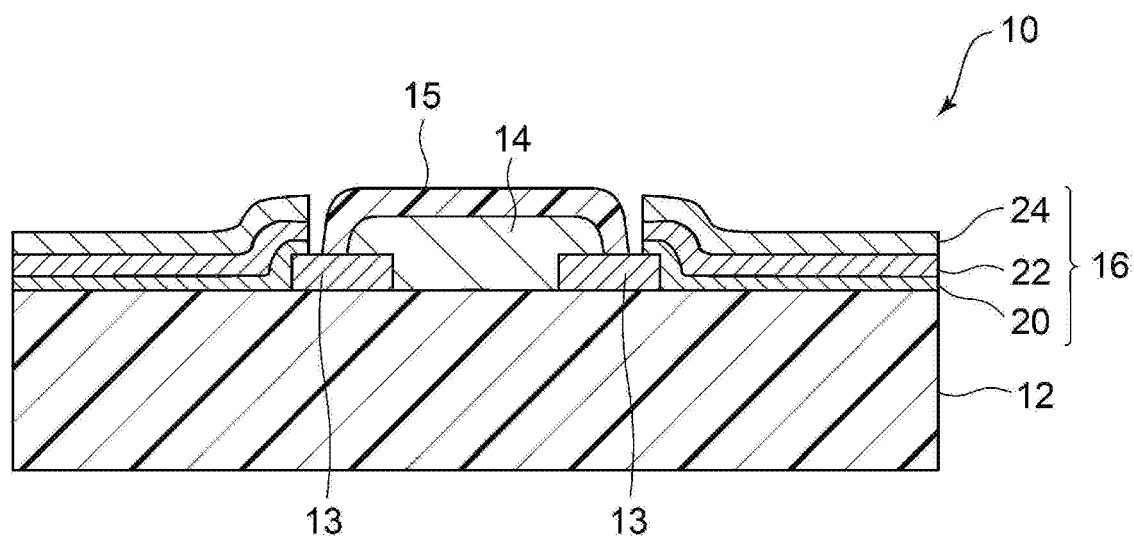
FIG. 1 is a cross-sectional view showing a laminated structure of an electronic component for welding according to at least one embodiment of the present invention.

FIG. 1 is a cross-sectional view showing a laminated structure of an electronic component 10 for welding according to at least one embodiment of the present invention.

The electronic component 10 for welding includes an ultrathin insulating substrate 12, a function part 14 which is a resistance part formed on the insulating substrate 12, a protective part 15 formed on the function part 14, a pair of electrode films 13 electrically connected to the function part 14 on the insulating substrate 12, and a pair of bonding electrode parts 16 electrically connected to the pair of electrode films 13.

The insulating substrate 12 is formed of ceramics excellent in electrical insulation properties such as alumina, zirconia, aluminum nitride, sapphire and the like. However, the insulating substrate 12 is not limited to ceramics containing crystals, but need only have necessary and sufficient insulating properties with respect to a laminated structure (at least the function part 14, the electrode film 13 and the bonding electrode part 16) in which a surface layer part thereof is formed on the side of an upper layer, and may be, for example, a semiconductor substrate (for example, a silicon substrate) in which an insulating film (for example, a silicon oxide film) is formed on a surface layer thereof. In the embodiment, these are included as the insulating substrate.

The insulating substrate 12 is not particularly limited in shape and size but usually has a plate-like shape. The insulating substrate 12 is, for example, an ultrathin insulating substrate of which a width is 0.2 to 0.8 mm, a length is about 0.4 to 1.6 mm, a thickness is preferably 100 μm or less and bending strength is 690 MPa or more. A volume of the insulating substrate 12 occupies most of a volume of the electronic component 10 for welding and is also related to a heat capacity of the electronic component 10 for welding and also thermal responsiveness (when the electronic component 10 for welding is used as a temperature sensor 200 (refer to FIGS. 15 and 16)). As a plate thickness of the insulating substrate 12 becomes smaller, the heat capacity of the electronic component 10 welding becomes smaller, and thus the thermal responsiveness is improved.

Figure 15:
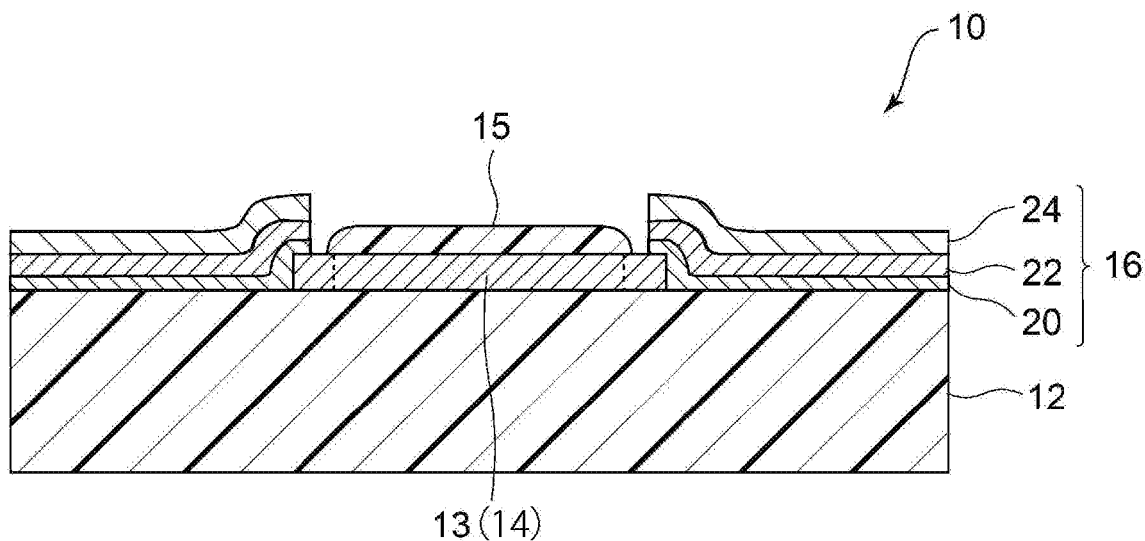
FIG. 15 is a longitudinal cross-sectional view showing a configuration example of a temperature measuring resistor constituting a temperature sensor.
Figure 16:
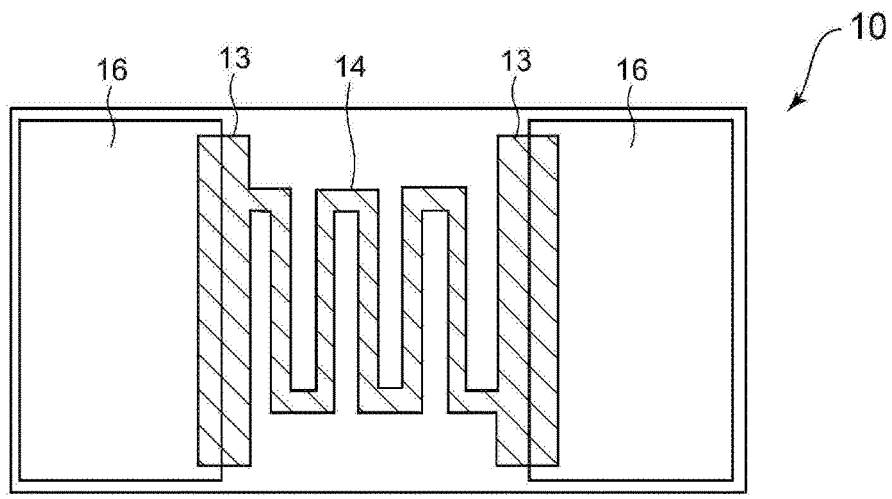
FIG. 16 is a plan view showing a layout of a function part and an electrode film in FIG. 15.

The function part 14 is a film-like heat sensing element of which a specific characteristic (generally, a resistance value), that is, a function value, changes according to temperature and is typically deposited using a thin film technique such as sputtering, vacuum deposition, CVD, ion plating, plating, and the like. Alternatively, the function part 14 may be formed by sintering a paste of a heat sensing element material on the insulating substrate 12 using a thick film technique such as printing. Any material exhibiting heat sensing characteristics can be used as a material of the function part 14. For example, a metal oxide containing manganese (Mn), nickel (Ni), cobalt (Co) or the like is used in the case of an NTC thermistor. Further, for example, as shown in FIGS. 15 and 16, in the case of the temperature sensor 200 such as the temperature measuring resistor, a metal (for example, platinum) is used as the material of the function part 14. In this case, the function part 14 and the electrode film 13 may be formed in the same layer.

Further, a film shape and a film structure of the function part 14 may be arbitrarily selected and may be formed in a single layer or multiple layers. A film thickness of the function part 14 is also not particularly limited and may be set to an arbitrary thickness according to required heat sensing characteristics. Generally, the function part 14 is covered and protected by the protective part 15 formed of a silicon oxide, a silicon nitride or the like. Also, the protective part 15 may have a structure in which a thick film glass, a heat resistant resin, and the like are provided on the covered protective film as necessary.

The function part 14 may be formed in direct contact with the surface layer of the insulating substrate 12, but a configuration in which one or more thin films are interposed between the function part 14 and the insulating substrate 12 is also possible. For example, when a heat treatment is performed on the function part 14 after the function part 14 is formed, an insulating film having low thermal conductivity such as a silicon oxide film, silicon nitride film, or the like may be formed on the insulating substrate 12 as a base film of the function part 14 to prevent components constituting the function part 14 from diffusing toward the insulating substrate 12 during the heat treatment and to keep the characteristics of the function part 14 stable. The function part 14 is in contact with the pair of electrode films 13 for electrical connection inside the protective part 15. The function value is a value of a characteristic of a resistor, a capacitor, an inductor or the like.

Normally, a pair of bonding electrode parts 16 are provided to face each other across the function part 14 on the insulating substrate 12. Each of the pair of bonding electrode parts 16 is electrically connected to the function part 14 via the electrode film 13 formed on the insulating substrate 12. In the example of FIG. 1, the function part 14 is formed as a resistance film, and the case in which the electrode film 13 is formed under the resistance film is shown, but the electrode film 13 may also be formed on the resistance film or in the resistance film. That is, when the function part 14 is covered with the protective part 15 as described above, as one form, a configuration in which the electrode film 13 also extends inside the protective part 15 and is directly connected to the function part 14 is adopted. As another form, a configuration in which the electrode film 13 extending only in the protective part 15 and connected to the function part 14 and the bonding electrode part 16 exposed outside the protective part 15 are connected to each other is adopted. Of course, the function part 14 may also have a multilayer structure.

The electrode film 13, the function part 14 and the bonding electrode part 16 have such a connection relationship and are directly or indirectly connected to each other. In the electrode film 13 in this embodiment, a shape and an extension range of the bonding electrode part 16 can also be arbitrarily set or selected. In the illustrated example, a pair of bonding electrode parts 16 are provided on a main surface of the insulating substrate 12 in parallel with the function part 14 on the left and right. However, although not shown, the bonding electrode part 16 may extend to a side surface or a back surface of the insulating substrate 12.

The bonding electrode part 16 is a multilayer film and functionally has three layers. That is, as shown in FIG. 1, the bonding electrode part 16 includes an active layer 20 which is formed on the insulating substrate 12, includes a high melting point metal as a main component and has an adhesive property, a barrier layer 22 which is formed on the active layer 20 as a layer integrated therewith or as an independent layer and includes a high melting point metal as a main component, and a bonding layer 24 which is formed on the barrier layer 22 and includes a low melting point metal as a main component. Here, the high melting point means that the melting point is higher than that of the low melting point metal.

The active layer 20 is formed to adhere to the surface of the insulating substrate 12 to increase a bonding strength between the insulating substrate 12 formed of a material such as ceramics and the bonding electrode part 16 and has a function of realizing excellent tensile strength when a lead 18 to be described later is bonded to the bonding electrode part 16. In addition, the active layer 20 satisfies a condition that the melting point thereof is high, and specifically, the active layer 20 has a melting point of 1300° C. or more, preferably 1400° C. or more. Such a material may have a characteristic of not melting during a welding process of bonding the lead 18 to the bonding electrode part 16. The material which satisfies the above-described function of the active layer 20 and the above-described conditions is any one of titanium, chromium, zirconium, tungsten, molybdenum, manganese, cobalt, nickel, tantalum, or an alloy or oxide thereof. For example, since titanium has a melting point of 1688° C., the pure metal can be used. On the other hand, for example, since manganese has a melting point of 1246° C., it can be used in the form of a manganese oxide (having a melting point 1945° C.) which is an oxide in a special form.

Figure 13:
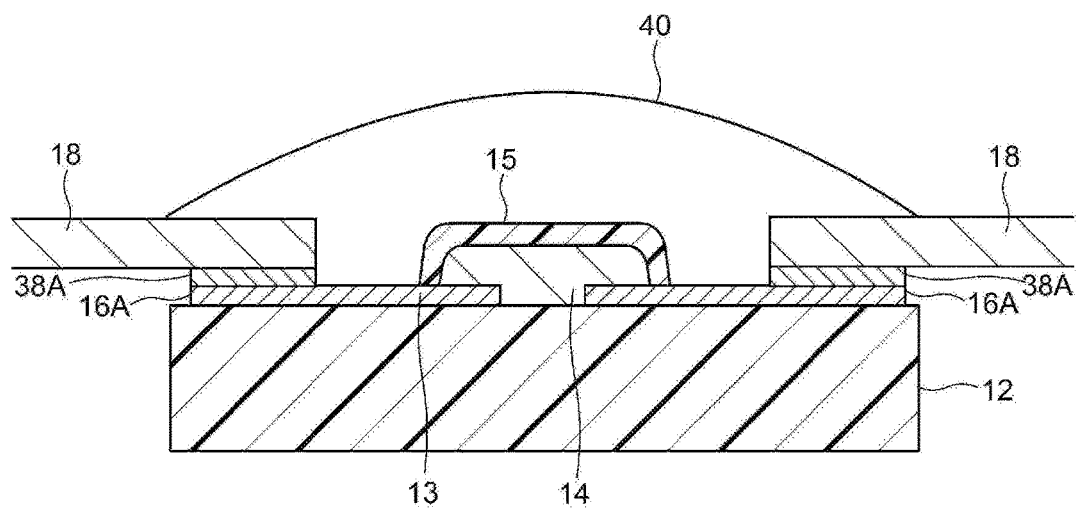
FIG. 13 is a longitudinal sectional view showing a configuration of Conventional Example 1.
Figure 14:
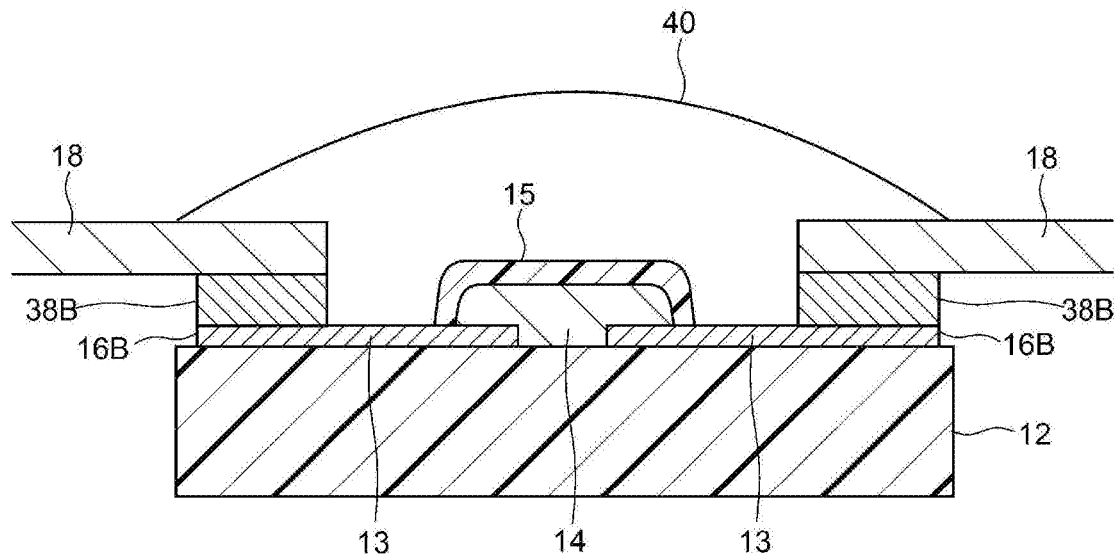
FIG. 14 is a longitudinal sectional view showing a configuration of Conventional Example 2.

In particular, conventionally, as shown in FIGS. 13 and 14 which will be described later, it is necessary to dispose a silver paste 38A or a gold bump 38B having a thickness of several tens of µm at a bonding part with the lead 18 and to further provide a glass protective layer 40 in order to ensure the sufficient tensile strength. On the other hand, in the electronic component 10 for welding of the present invention, since the active layer 20 is provided in the bonding electrode part 16, it is possible to realize the sufficient tensile strength with a thin configuration without providing any of the bump, the silver paste and the glass protective layer.

Although a thickness of the active layer 20 is not particularly limited, it can be formed as thin as possible to an extent that an adhesive function can be maintained, and for example, in the case of titanium which is a metal, it can be formed as thin as 0.01 μm. Since an active metal such as titanium has extremely high activity, it can serve as a function film having adhesiveness even with an ultrathin film.

The barrier layer 22 which includes a high melting point metal as a main component serves as a barrier layer without melting during a bonding process of the lead 18 to the bonding electrode part 16 by managing the process not to reach the melting point during the process. The barrier layer 22 of the high melting point metal satisfies the condition that the melting point thereof is at least 1300° C. or more, preferably 1400° C. or more, while performing the above-described function. A preferable material suitable for this condition is any of platinum, vanadium, hafnium, rhodium, ruthenium, rhenium, tungsten, molybdenum, nickel, tantalum, or an alloy thereof. Incidentally, the melting point of platinum is 1768° C., and the melting point of molybdenum is 2622° C.

The barrier layer 22 of the high melting point metal may be generally formed as an independent layer which overlaps the active layer 20. For example, the barrier layer 22 of the high melting point metal which is platinum is formed on the active layer 20 formed of titanium. However, the barrier layer 22 of the high melting point metal may be formed as a layer formed of the same material as the active layer 20 or a layer integrated therewith.

For example, a configuration in which a barrier layer 22 of the high melting point metal which is molybdenum may be formed integrally or separately on the active layer 20 formed of molybdenum is also possible. In this case, the active layer 20 and the barrier layer 22 of the high melting point metal are formed by the same process.

A thickness of the barrier layer 22 of the high melting point metal is also not particularly limited, but in this embodiment, it is set to 0.1 to 0.4 μm. This is because, when the film thickness becomes thinner than 0.1 μm, the melting point lowers due to alloying and there is a possibility of melting in the welding process. For example, when platinum is used as a material, since it is an expensive material, it is desirable to reduce the thickness as much as possible, and an optimum thickness can be, for example, 0.15 μm.

The bonding layer 24 is formed as an independent layer which overlaps the barrier layer 22 of the high melting point metal. The bonding layer 24 forms a bonding structure with the lead 18 by melting in the welding process of the lead 18 to the bonding electrode part 16 (at this time, the high melting point metal does not melt at all except for an alloyed portion of the barrier layer 22). In the welding process, when heat or energy (for example, energy from laser welding, spot welding, pulse heat, or the like) is supplied from the outside via the lead 18, the bonding layer 24 melts promptly. In this way, the bonding layer 24 has a function of performing the welding by melt bonding or diffusion bonding due to fusion welding, brazing and pressure welding to the lead 18. To realize this function, the bonding layer 24 of a low melting point metal is required to have a melting point lower than 1300° C. The low melting point metal material suitable to satisfy this condition is a pure metal or an alloy which includes at least one of gold (having a melting point of 1064° C.), silver (having a melting point of 961° C.) and copper (having a melting point of 1085° C.) as a main component.

Although a thickness of the bonding layer 24 is also not particularly limited, in this embodiment, it is possible to form the film thickness as thin as possible, and for example, when gold is used as the material, it may be formed as thin as 0.1 to 0.4 μm.

Assuming that the film thickness of each of the above-described three layers is 0.01 μm for the active layer 20, 0.15 μm for the barrier layer and 0.2 μm for the bonding layer, the total thickness of the bonding electrode part can be formed as thin as 0.36 μm. In this way, the film thickness can easily be set to 1 μm or less.

Figure 2:
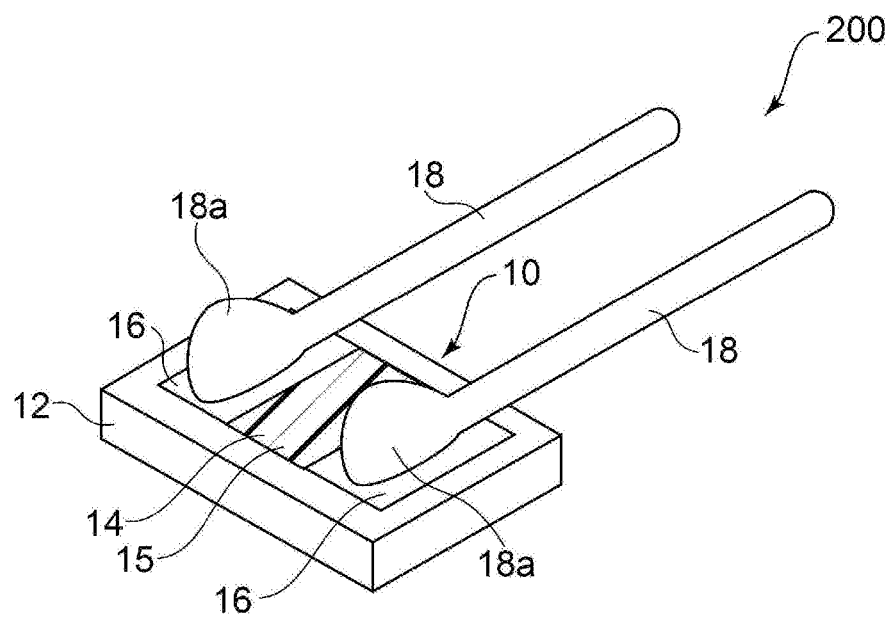
FIG. 2 is a perspective view showing an example of a temperature sensor in which leads are connected to the electronic component for welding shown in FIG. 1.
Figure 3:
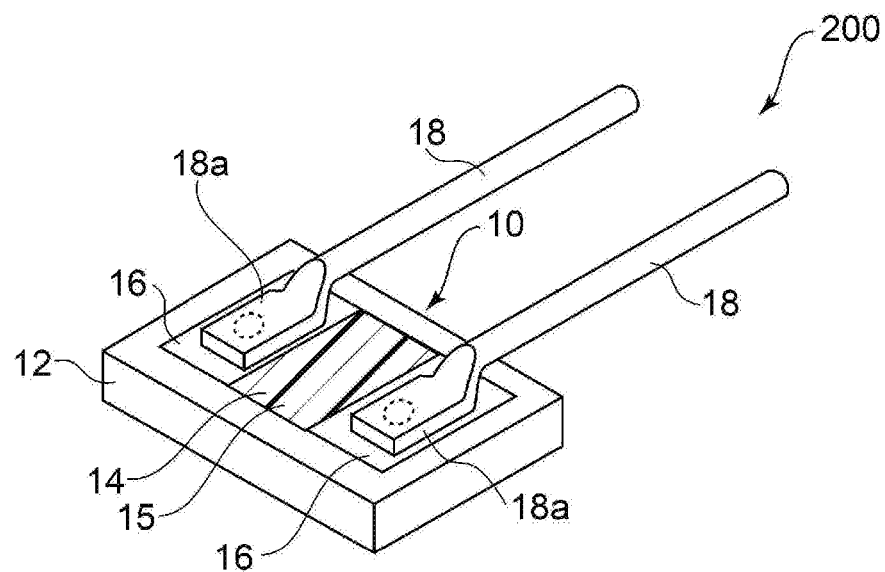
FIG. 3 is a perspective view showing an example of a temperature sensor in which leads are connected to the electronic component for welding shown in FIG. 1.
Figure 4:
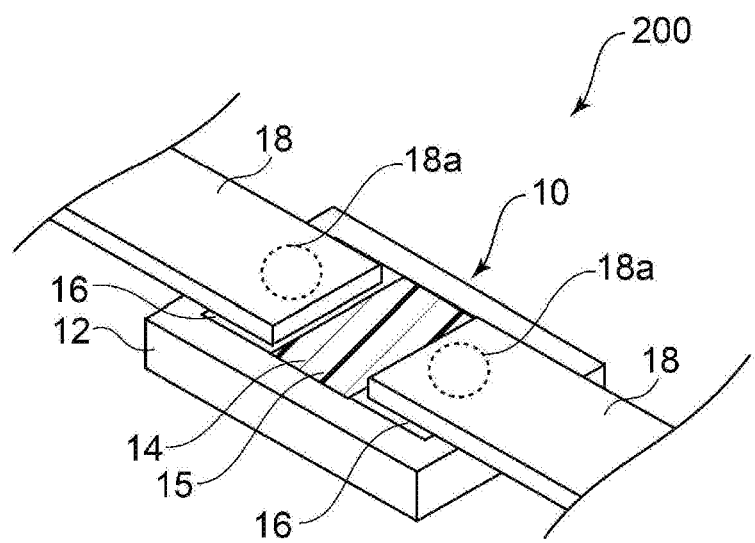
FIG. 4 is a perspective view showing an example of a temperature sensor in which leads are connected to the electronic component for welding shown in FIG. 1.

Subsequently, a mode in which the lead 18 is bonded by welding to the bonding electrode part 16 (the bonding layer 24) of the electronic component 10 for welding having the above-described configuration will be described. FIGS. 2 to 4 are perspective views showing the temperature sensor 200 to which the lead 18 is connected to the electronic component 10 for welding of FIG. 1.

The lead 18 is bonded to the bonding layer 24 of the bonding electrode part 16 by bonding processing. Here, various types of welding including fusion welding, pressure welding, and brazing can be widely adopted for the bonding processing which is applied to the lead 18 with respect to the bonding electrode part 16. Such welding includes, for example, resistance welding, ultrasonic welding, friction welding, and the like which are contact bonding, and laser welding, electron beam welding, and the like which are non-contact bonding.

The lead 18 is welded to the bonding electrode part 16 via a welding part 24a (refer to FIG. 6) of the bonding layer 24 by melt bonding or diffusion bonding. In the welding process of the leads 18, the leads 18 do not melt the barrier layer 22 of the high melting point metal at all or almost, absorbs heat or energy (for example, energy of a laser beam) supplied from the outside, heats the bonding layer 24 and melts together with the bonding layer 24, or melts or diffuses only the bonding layer 24 and performs the welding. A preferable material for satisfying this condition is a metal or an alloy including gold, silver and copper, which are low melting point metals, as a main component, and particularly suitable alloys are phosphor bronze, beryllium copper, brass, white copper, nickel silver, constantan, copper silver alloy, copper iron alloys, and copper gold alloys. Incidentally, phosphor bronze has a melting point of 1000° C., and constantan has a melting point of 1225° C. to 1300° C.

A form of the lead 18 includes a lead wire or a wiring pattern, and a round wire, a plate shape or a foil shape can suitably be used. A thickness or a plate thickness of the lead 18 is not particularly limited, but when necessary tensile strength can be maintained, a thin line as thin as possible is suitable for the round wire, and a plate or a foil as thin as possible is suitable for the plate shape. Further, in the case of the round wire, a flattened part formed by applying a pressure to a tip end thereof may be used for welding. In the examples of FIGS. 2 to 4, the temperature sensor 200 is formed by respectively connecting a pair of leads 18 to the pair of bonding electrode parts 16. The pair of leads 18 extend in a direction (FIG. 2 and FIG. 3) orthogonal to or a direction (FIG. 4) parallel with a longitudinal direction (an arrangement direction of the function part 14 and the bonding electrode part 16) of the electronic component 10 for welding in the temperature sensor 200 and are bonded to the corresponding pair of bonding electrode parts 16, respectively.

In FIG. 2, the tip end (a bonded part) 18a of the lead 18 is bonded in a state of the round wire. In FIG. 3, the tip end (the bonded part) 18a of the lead 18 is bonded in a state in which the tip end is crushed into a thin plate shape. In FIG. 4, the lead 18 is in the form of a thin plate or a foil. In this case, the pair of leads 18 are respectively bonded to the corresponding bonding electrode parts 16 to face each other in the longitudinal direction of the electronic component 10 for welding in the temperature sensor 200. Further, the tip end (the bonded part) 18a of the lead 18 is not covered with the glass protective layer or the like and is exposed to the outside.

Figure 5:
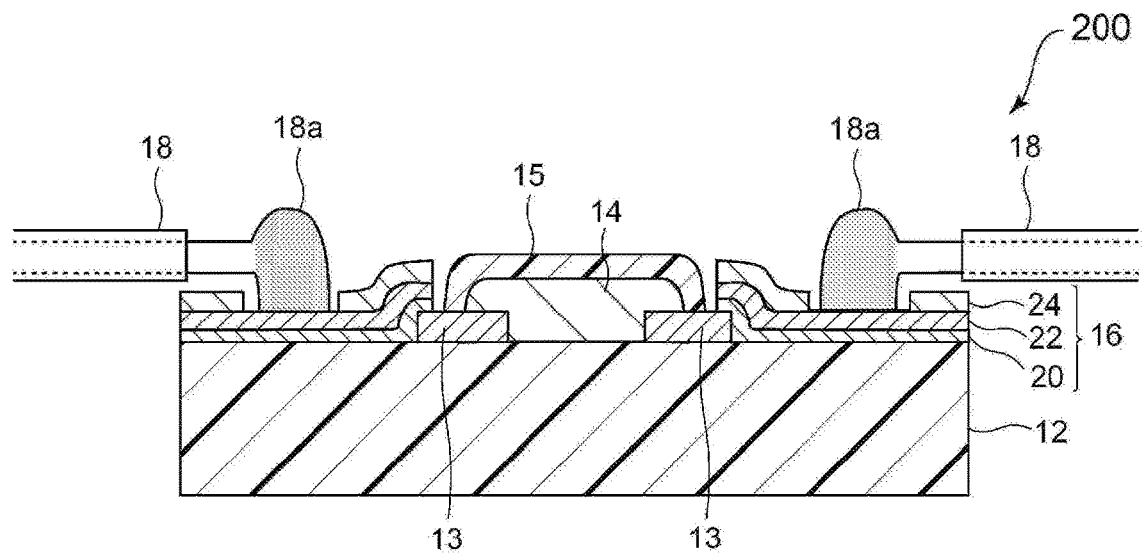
FIG. 5 is a cross-sectional view taken along the lead of FIG. 2.
Figure 6:
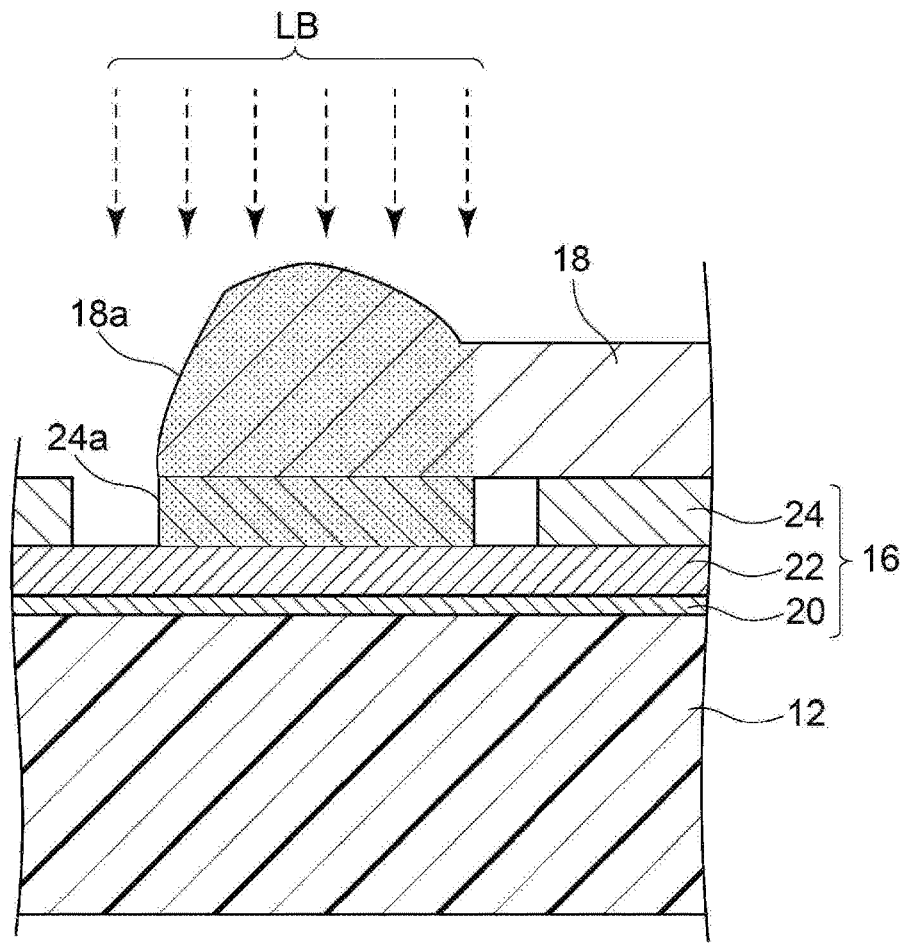
FIG. 6 is an enlarged view of a tip end of FIG. 5.

In these embodiments, when a laser beam is used for the welding of the leads 18, two types of modes are obtained in a bonded state of the lead 18 and the bonding electrode part 16. In a first welding mode, as shown in FIG. 2, the tip end 18a of the lead 18 melts and contracts in a plane direction to cause deformation extending (protruding) in a height direction, and the bonding layer 24 also melts and is melt-bonded by fusion welding. Here, FIG. 5 is a cross-sectional view taken along the lead 18 of FIG. 2, and FIG. 6 is an enlarged view of the tip end 18a of FIG. 5. As shown in FIG. 5, an insulating film of the lead 18 in the vicinity of the tip end 18a is removed by irradiating the tip end 18a with a laser from the upper side, and the exposed tip end 18a is melt-bonded to the bonding electrode part 16. As shown in FIGS. 5 and 6, when the tip end 18a is bonded to the bonding electrode part 16, the bonding layer 24 in a region of the bonding electrode part 16 in which the laser irradiation is performed is partially melted and fused to the tip end 18a melted by the laser irradiation in the same manner. At this time, since energy due to the laser irradiation is transmitted slightly to a periphery from the irradiation region, the bonding layer 24 melts over a region somewhat wider than a laser irradiation range. Then, the molten bonding layer 24 is integrated with the melted tip end 18a, and a tip shape which rises upward (refer to dot meshing portions in FIGS. 5 and 6) is formed. Such a rising shape ranges on an order of several tens of μm and generally hinders a reduction of thickness, but since the bonding electrode part 16 is formed to be thinner than the conventional electrode film as described above, it is possible to alleviate the hindering to the reduction of thickness due to such a rising shape.

Also, although FIG. 6 shows an example in which a welding part 24a of the bonding layer 24 reaches the barrier layer 22, there is no problem even when the welding part stops in the middle of the bonding layer 24 in a thickness direction. The reason why there is no problem even when the welding part 24a reaches the barrier layer 22 is because the barrier layer 22 of the high melting point metal does not reach the melting point and thus serves as a barrier layer without melting.

Figure 7:
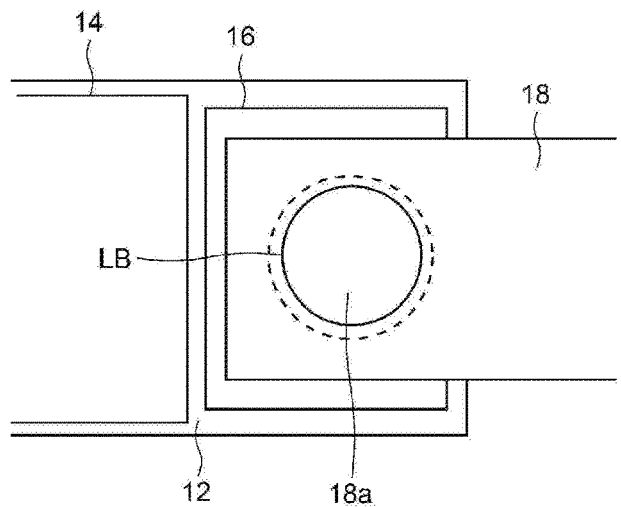
FIG. 7 is a plan view schematically showing an irradiation range of a laser beam.

Also, as shown in FIG. 2, when a laser beam is irradiated to the lead 18 which is a round wire from the upper side, as shown in FIG. 7, a beam spot LB of the laser beam is irradiated to the tip end (the bonded part) of the lead 18, and the lead 18 and the bonding layer 24 are melt-bonded.

Figure 8:
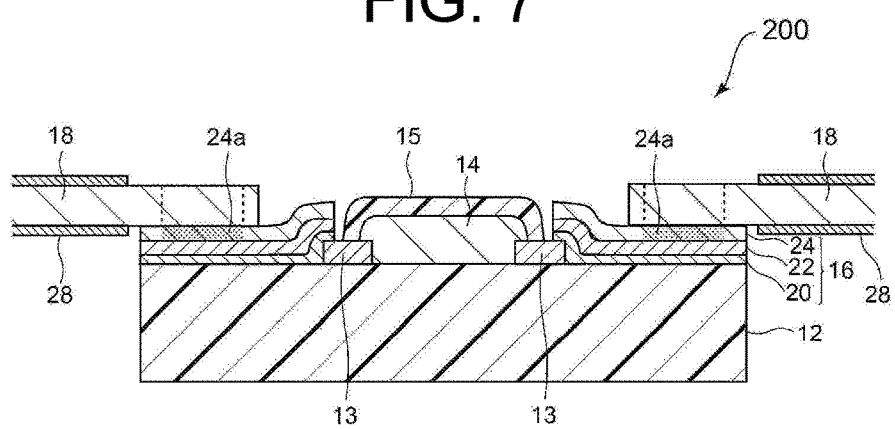
FIG. 8 is a schematic view showing a cross section of a temperature sensor in which leads are diffusion-bonded.
Figure 9:
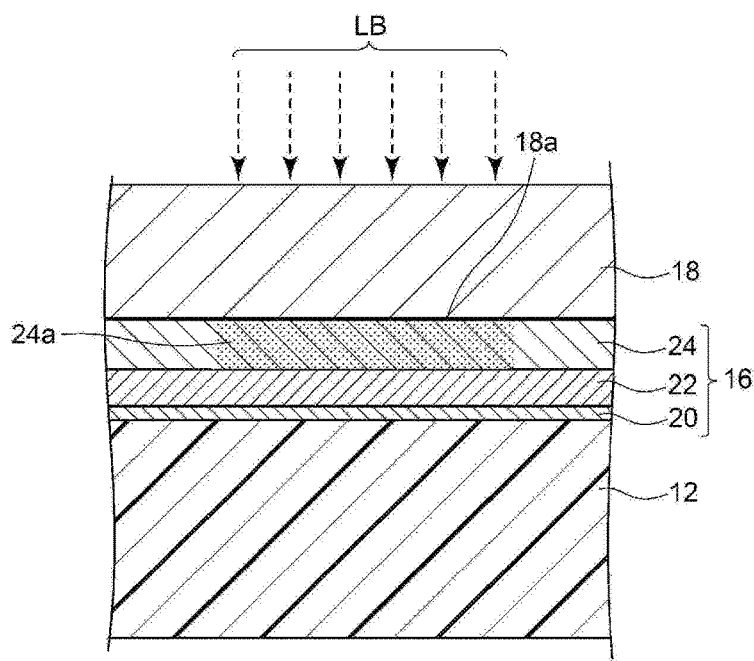
FIG. 9 is an enlarged cross-sectional view of a diffusion bonding part in FIG. 8.

In a second welding mode, as shown in FIG. 8 and FIG. 9, the tip end (the bonded part) 18a of the lead 18 exposed from an insulating film 28 is bonded to the bonding electrode part 16 by diffusion bonding. In this mode, the lead 18 is hardly deformed, and the lead 18 is diffusion-bonded to the bonding layer 24 by a diffusion phenomenon due to energy such as heat and pressure. FIG. 9 shows a state in which the laser beam is applied to a range LB with respect to the lead 18 mounted on the bonding electrode part 16 in such a mode. Due to the energy supplied by such a laser beam, the lead 18 and the bonding layer 24 on the side of the lower layer are diffusion-bonded.

In the second welding mode, as shown in FIGS. 8 and 9, the lead 18 on the side of the surface layer is hardly deformed, and only the bonding layer 24 on the side of the inner layer is deformed. Therefore, as shown in FIGS. 5 and 6, since the side of the surface layer has the rising shape by welding, there is no hindrance to the reduction of thickness. That is, it is advantageous for the reduction of thickness.

In this second mode, the lead 18 may not melt, but the bonding may be performed by brazing in which only the bonding layer 24 melts. FIGS. 8 and 9 show an example in which the welding part 24a of the bonding layer 24 reaches the barrier layer 22 of the high melting point metal, but even when it does not reach the barrier layer 22 and stops on the way, there is no problem on the bonding strength. However, in an embodiment to be described later, since the bonding layer 24 is extremely thin, it melts completely just below the beam spot of the laser beam and is bonded to the lead 18.

Figure 10A:
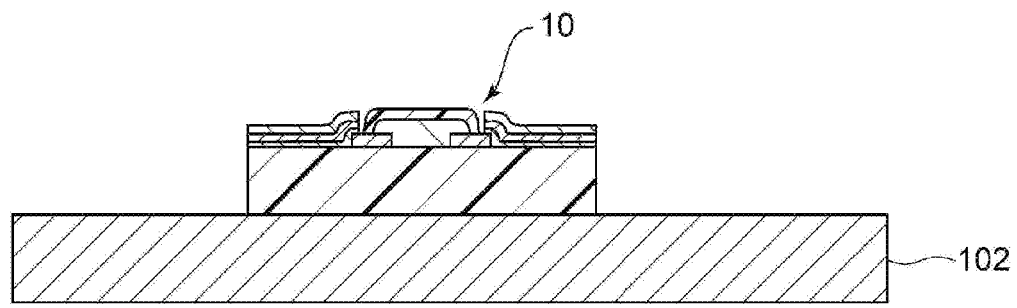
FIG. 10($a$) to FIG. 10($c$) are cross-sectional views showing a built-in process of the electronic component for welding into a laminated circuit board in a process of manufacturing a temperature sensor for each step.
Figure 10B:
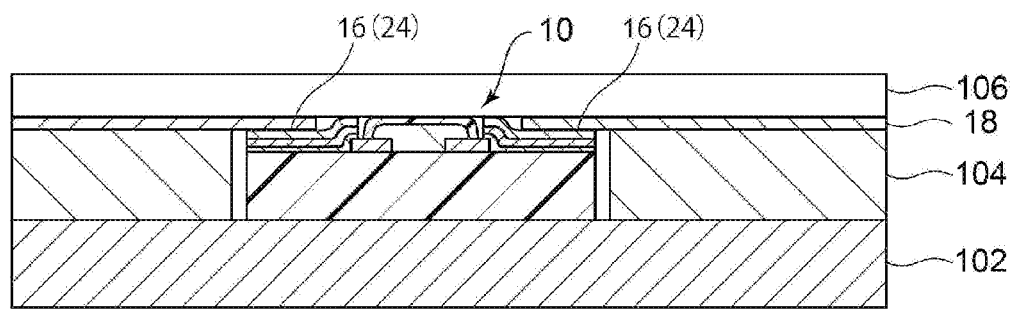
Figure 10C:
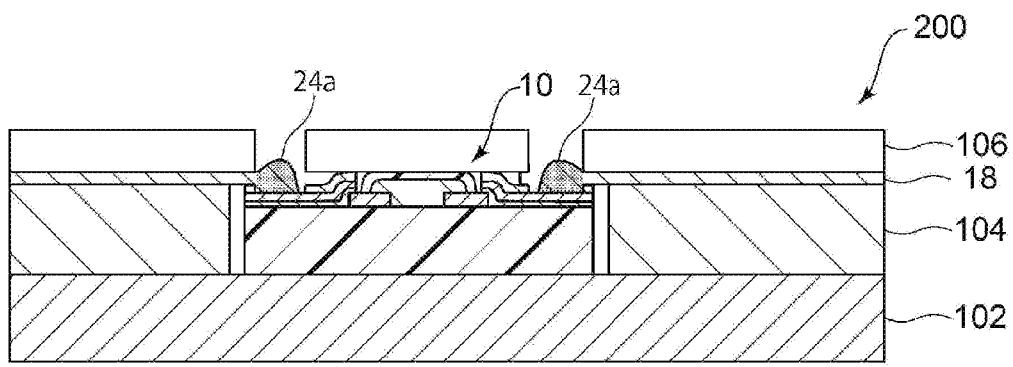

Further, as shown in FIG. 10(a) to FIG. 10(c), the electronic component 10 for welding may be configured as the temperature sensor 200 by being built in a laminated circuit board which is a multilayer board. FIG. 10(a) to FIG. 10(c) are cross-sectional views showing a built-in process of the electronic component 10 for welding into the laminated circuit board for each step.

In the built-in process, first, as shown in FIG. 10(a), the electronic component 10 for welding is fixed to a sheet 102 called an insulating prepreg by an adhesive (not shown). Next, as shown in FIG. 10(b), an insulating sheet 104 in which a through hole for accommodating the electronic component 10 for welding is formed in advance is superimposed on the sheet 102. Then, the lead 18 having a predetermined wiring pattern is disposed on the sheet 104, and a sheet 106 is further superimposed thereon.

A laminated body thus obtained may be pressed by a hot press method or the like to bring laminated structures into close contact with each other.

Subsequently, as shown in FIG. 10(c), a laser beam is irradiated to a region corresponding to the bonding electrode part 16 of the electronic component 10 for welding which is built in from the upper side (the side of the sheet 106). Then, the irradiated region of the sheet 106 is removed by the energy of the laser beam, and the lead 18 and the bonding electrode part 16 on the side of the lower layer are welded together (only the bonding layer 24 melts, and the active layer 20 and the barrier layer 22 do not melt in the bonding electrode part 16). In this way, the temperature sensor 200 having the above-described configuration is completed through a process including three steps which are roughly classified into FIGS. 10(a) to 10(c).

As described above, the built-in process of the electronic component 10 for welding to the laminated circuit board using welding is simpler than a conventional built-in process. Here, a built-in process using printing processing disclosed in Patent Literature 4 will be described as a comparative example. FIG. 11(a) to FIG. 11(e) are cross-sectional views showing a built-in process according to a comparative example for each step.

Figure 11A:
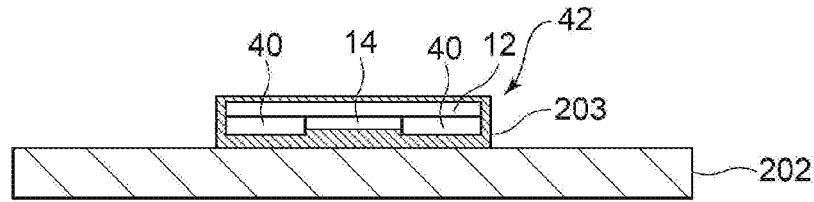
FIG. 11($a$) to FIG. 11($e$) are cross-sectional views showing a built-in process according to a comparative example for each step.
Figure 11B:
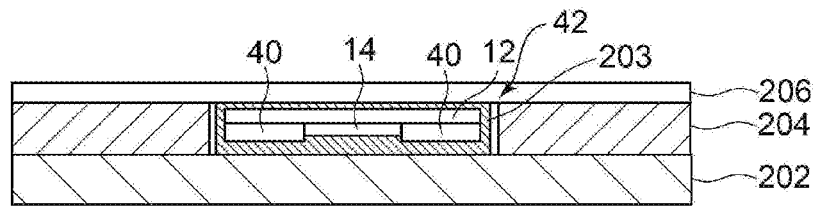
Figure 11C:
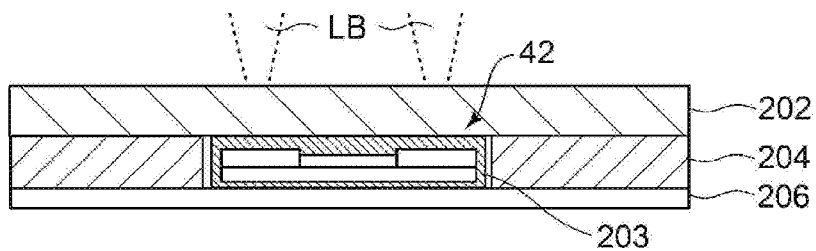
Figure 11D:
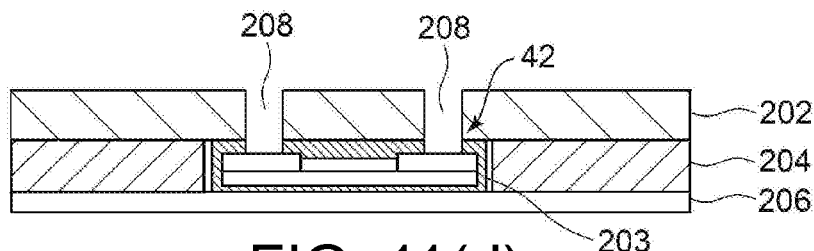
Figure 11E:
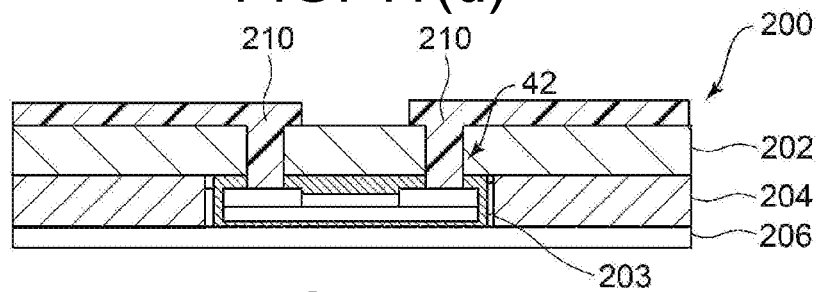

In this comparative example, a process in which an electronic component 42 having a single-layer electrode part 40 on both sides of the function part 14 on the insulating substrate 12 is built in the laminated circuit board is shown. First, as shown in FIG. 11(a), the electronic component 42 is fixed to an insulating sheet 202 with an adhesive 203. Next, as shown in FIG. 11(b), the sheet 204 having the through hole in which the electronic component 42 is accommodated is superimposed on the sheet 202, a transparent sheet 206 is further superimposed thereon, and thus a laminated body is obtained. As shown in FIG. 11(c), the laminated body configured in FIG. 11(b) is heat-pressed, and then upper and lower sides thereof are reversed. Subsequently, a laser beam is irradiated to a position corresponding to the single-layer electrode part 40 of the electronic component 42 to partially sublimate the sheet 202.

In this way, a via hole 208 is formed as shown in FIG. 11(*d*). The single-layer electrode part 40 is exposed in the via hole 208. Additionally, as shown in FIG. 11(*e*), a conductive material is filled in the via hole 208 to form a via 210, and a wiring pattern connected to the via 210 is printed on a surface of the sheet 202. As described above, the built-in process of the comparative example has five steps roughly classified into FIGS. 11(*a*) to 11(*e*) and is very complicated as compared with the built-in process of the present invention including the above-described three steps of FIGS. 10(*a*) to 10(*c*). As described above, the electronic component 10 for welding can simplify an assembling process when it is mounted on the laminated circuit board and can be mounted with high reliability and high density.

Figure 12:
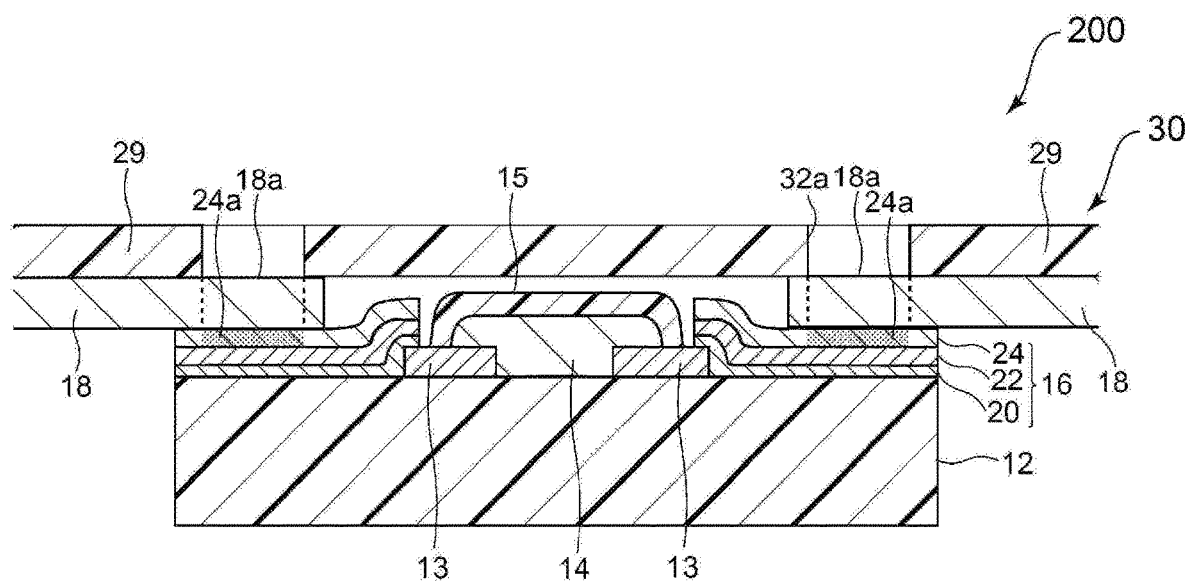
FIG. 12 is a cross-sectional view of a temperature sensor in which the electronic component for welding of FIG. 1 is mounted on a flexible wiring board.

Incidentally, a mounting target of the electronic component 10 for welding may be, for example, a flexible wiring board (FPC) 30, as shown in FIG. 12. In FIG. 12, the flexible wiring board 30 including the lead 18 having a predetermined wiring pattern and an insulating layer 29 formed of polyimide is shown. The flexible wiring board 30 is irradiated with a laser beam from the upper side in a state in which the lead 18 is disposed to be in contact with the bonding layer 24 of the electronic component 10 for welding. A region 32*a* of the insulating layer 29 irradiated with the laser beam is partially removed by sublimation, and the lead 18 and the bonding layer 24 are bonded to each other on the side of the lower layer in the second bonding mode. In this case, the tip end (the bonded portion) 18*a* of the lead 18 is exposed to the outside.

EXAMPLE

Next, a result of experimentally verifying the temperature sensor 200 in which the lead 18 is connected to the electronic component for welding having the above-described configuration will be described on the basis of a specific example. Table 1 shows specifications and measurement results of test targets used in this verification. As shown in Table 1, in the verification, the test targets according to Present Inventions 1 to 6, Comparative Example, and Conventional Examples 1 to 3 were prepared as test targets.

TABLE 1

Evaluation results of specifications and tensile strength of test targets

| | Thick film electrode of bonding part | Thin film electrode layer of welding part (melting point) | | | Lead wire (lead) | | Evaluation |
|---|---|---|---|---|---|---|---|
| | Bonding material (film thickness) | Adhesive metal (1300° C. or more) | High melting point (1300° C. or more) | Low melting point (1300° C. or less) | Material (shape) | Melting point | Tensile strength |
| Present Invention 1 | — | Titanium 0.01 μm(1688° C.) | Platinum 0.15 μm(1768° C.) | Gold 0.2 μm(1064° C.) | Phosphor bronze (plate 100 μm) | 1000° C. | 740 g |
| Present Invention 2 | — | Titanium 0.01 μm(1688° C.) | Platinum 0.15 μm(1768° C.) | Gold 0.2 μm(1064° C.) | Phosphor bronze (foil 80 μm) | 1000° C. | 430 g |
| Present Invention 3 | — | Titanium 0.01 μm(1688° C.) | Platinum 0.15 μm(1768° C.) | Gold 0.2 μm(1064° C.) | Phosphor bronze (foil 50 μm) | 1000° C. | 410 g |
| Present Invention 4 | — | Titanium 0.01 μm(1688° C.) | Platinum 0.15 μm(1768° C.) | Gold 0.2 μm(1064° C.) | Constantan (foil 80 μm) | 1240° C. | 300 g |
| Present Invention 5 | — | Titanium 0.01 μm(1688° C.) | Platinum 0.15 μm(1768° C.) | Gold 0.2 μm(1064° C.) | Constantan (foil 50 μm) | 1240° C. | 240 g |
| Present Invention 6 | — | Titanium 0.01 μm(1688° C.) | Platinum 0.15 μm(1768° C.) | Gold 0.2 μm(1064° C.) | FPC (copper 18 μm PI 25 μm) | 1064° C. | 220 g |
| Comparative Example | — | Titanium 0.01 μm(1688° C.) | Platinum 0.15 μm(1768° C.) | Gold 0.2 μm(1064° C.) | SUS304 (plate 100 μm) | 1420° C. | 40 g |
| Conventional Example 1 | Silver paste (20 μm) | — | Platinum 0.15 μm(1768° C.) | — | Kovar(80 μm) + glass | 1450° C. | 200 g |
| Conventional Example 2 | Gold bump (40 μm) | — | Platinum 0.15 μm(1768° C.) | — | Kovar(80 μm) + glass | 1450° C. | 200 g |
| Conventional Example 3 | Gold bump (40 μm) | — | Platinum 0.15 μm(1768° C.) | — | Dumet(Φ100 μm) | 1430° C. | 100 g |

In these test targets, alumina which was a ceramic having a width of 500 μm, a length of 1000 μm, and a thickness of 100 to 150 μm was used as the insulating substrate 12. Further, the material of the function part 14 was a composite metal oxide for NTC thermistors. The material of the electrode film 13 was platinum. In the bonding electrode part 16, the active layer 20 was formed of titanium having a thickness of 0.01 μm, the barrier layer 22 of the high melting point metal was formed of platinum having a thickness of 0.15 μm, and the bonding layer 24 was formed of gold having a thickness of 0.2 μm.

As the lead 18, a phosphor bronze thin plate having a thickness of 100 μm was used in Present Invention 1, a phosphor bronze foil having a thickness of 80 μm was used in Present Invention 2, a phosphor bronze foil having a thickness of 50 μm was used in Present Invention 3, a constantan foil having a thickness of 80 μm was used in Present Invention 4, and a constantan foil with a thickness of 50 μm was used in Present Invention 5. Further, Present Invention 6 has a structure shown in FIG. 12, and a copper wiring pattern with a thickness of 18 μm is used as the lead 18, and an FPC formed of polyimide (PI) with a thickness of 25 μm is used as the insulating layer 29. Comparative Example in which all the conditions except for the lead 18 were the same as those of Present Inventions 1 to 6 and a thin lead having a thickness of 100 μm and formed of stainless steel (SUS 304) was used as the lead 18 was provided.

Conventional Example 1 has a structure shown in FIG. 13, in particular, a bonding electrode part 16A composed of a titanium layer having a thickness of 0.01 μm and a platinum layer having a thickness of 0.15 μm is used, a silver paste 38A having a thickness of 20 μm is interposed as a conductive adhesive between the bonding electrode part 16A and the lead 18, and Kovar (80 μm) is adopted as a material of the lead 18. Also, Conventional Example 2 has a structure shown in FIG. 14, in particular, a bonding electrode part 16B composed of a platinum layer having a thickness of 0.15 μm and a gold bump 38B having a thickness of 40 μm is used, and Kovar (80 μm) is adopted as the material of the lead 18, as in Conventional Example 1. In these Conventional Examples 1 and 2, since it is difficult to obtain tensile strength with the lead 18, a reinforcing glass protective layer 40 is provided over the entire upper portion of the bonding part for reinforcement. Also, Conventional Example 3 has a structure disclosed in Japanese Patent Laid-Open No. 2008-241566, and a Dumet wire having a diameter of 100 μm is used as the lead 18.

First, verification results of the tensile strength with respect to these test targets will be described. The tensile strength test was conducted according to the test of "Terminal strength test method" of JIS C0051.

As a result, as shown in Table 1, in each of Present Invention 1 to 6, a tensile strength greater than 200 g which is a practically allowable reference value or a lower limit value was obtained. When comparing the tensile strength among Present Inventions 1 to 6, as the melting point of the material used for the lead 18 increases, the tensile strength tends to decrease. However, it was confirmed that tensile strengths of 240 g and 300 g can be secured also in Present Inventions 4 and 5 having the highest melting point among them.

In the results, it can be understood that, in the case of constantan having a melting point of 1220° C. to 1300° C., a strength of 200 g or more can be secured, whereas in the case of SUS 304 having a melting point of 1420° C., a strength thereof is extremely reduced to 40 g. From this, it is necessary that the low melting point metal be 1300° C. or less.

Even with constantan having a melting point of 1300° C. or less, it is expected from the data that the strength of 200 g cannot be secured when a plate thickness thereof is thinner than 50 μm. In this case, the problem can be solved using a flexible substrate.

Also, in Present Invention 6, it is an ultrathin copper foil layer with a thickness of 18 μm using the flexible substrate, but a tensile strength of 220 g can be obtained by providing a polyimide (PI) layer having a thickness of 25 μm.

On the other hand, in Conventional Examples 1 and 2, although the tensile strength of 200 g was achieved, as shown in FIGS. 13 and 14, this is due to the glass protective layer 40 for reinforcement which covers the entire upper portion of the bonding part or the entire upper portion of the substrate. In such a glass protective layer 40, the total thickness of the temperature sensor becomes extremely large (the glass protective layer 40 becomes about twice as large as that of the insulating substrate 12), a heat capacity increases, and thermal responsiveness decreases. In fact, it is difficult to achieve a tensile strength of 200 g when the glass protective layer 40 is not present in Conventional Examples 1 and 2 (the tensile strength of Comparative Examples with Kovar and stainless steel is 20 g to 40 g, and it is difficult to put into practical use without reinforcement with the glass protective layer 40). Further, in Conventional Example 3, the tensile strength is 100 g, and sufficient results are not obtained.

In the tensile strength test, as described above, in Present Inventions 1 to 6, it was verified that sufficient tensile strength beyond the allowable reference value (200 g) can be achieved without forming the glass protective layer 40 for reinforcement as in Conventional Example.

In the temperature sensor 200 in which the leads 18 are bonded as described above, the tensile strength required for the leads 18 is generally about 200 g or more. When the lead 18 is a copper-silver alloy wire, since a tensile strength of a wire diameter of 50 μm is 300 g, it can be sufficiently used. On the other hand, in the case of the constantan foil, the tensile strength of the plate thickness of 50 μm is 400 g or more which is sufficient strength. The thermal responsiveness of the temperature sensor 200 can be extremely enhanced using the thin wire or the thin foil for the lead 18 in this way.

Results of verifying the thermal responsiveness with respect to the test targets will be described. As illustrated in FIG. 19A to FIG. 19D and in the following Table 2, it shows measurement results of a total thickness and a thermal time constant (the thermal responsiveness) of the temperature sensor 200 in the above-described Conventional Examples 1 and 2 and Present Inventions 2 and 6. Here, the thermal time constant is an index of thermal responsiveness and is defined as a time required for a temperature of each of the test targets to change by 63.2% when each of the test targets is charged with electric power and rapidly changed from a thermal equilibrium state to a zero load state.

TABLE 2

Measurement results of total thickness and thermal responsiveness of each test target

Figure 19A:
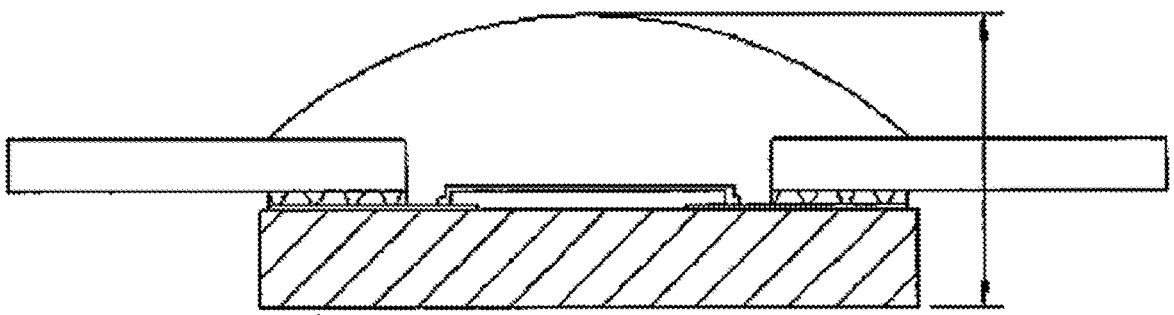
FIG. 19A to FIG. 19D illustrate the sectional shape and total thickness of a temperature sensor in Conventional Examples 1 and 2 and Present Inventions 2 and 6.
Figure 19B:
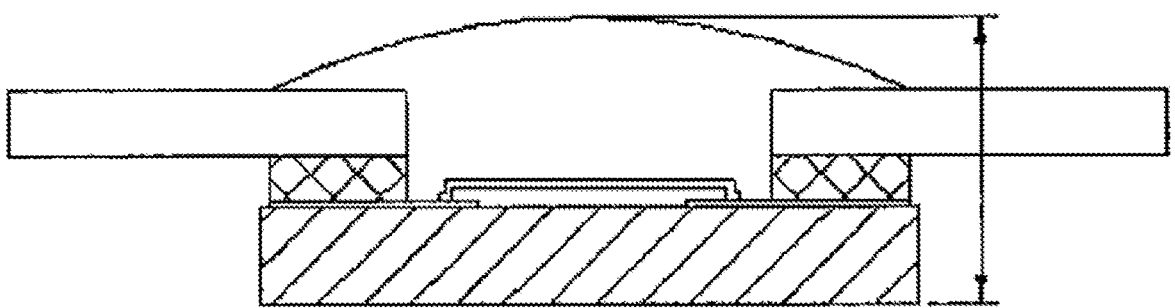
Figure 19C:
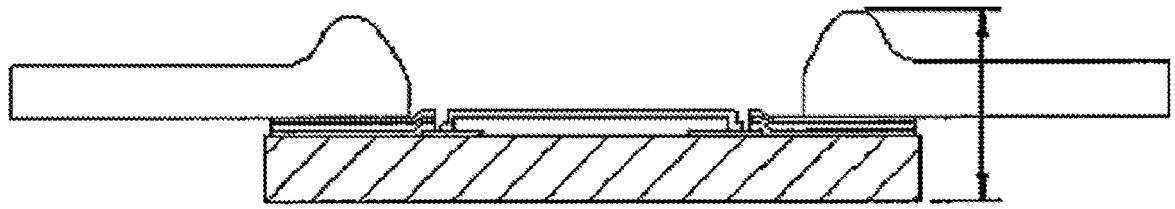
Figure 19D:
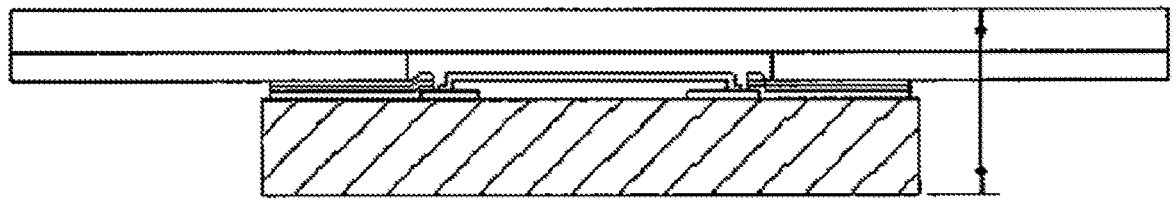

| | Sectional shape and total thickness | Total thickness | Thermal time constant |
|---|---|---|---|
| Conventional Example 1 | see FIG. 19A | 0.45 mm | 0.7 seconds |
| Conventional Example 2 | See FIG. 19B | 0.45 mm | 0.7 seconds |
| Present Invention 2 | See FIG. 19C | 0.26 mm | 0.3 seconds |
| Present Invention 6 | See FIG. 19D | 0.190 mm | 0.2 seconds |

In Conventional Example 1, the total thickness of the temperature sensor 200 was 0.45 mm, and the thermal time constant was 0.7 seconds. In Conventional Example 2, the total thickness of the temperature sensor 200 was 0.45 mm, and the thermal time constant was 0.7 second. On the other hand, in Present Invention 2, the total thickness of the temperature sensor 200 was 0.26 mm, and the thermal time constant was 0.3 seconds. This result is largely related to a fact that the total thickness is remarkably reduced because, in Present Invention 2, there is no need to provide the glass protective layer 40 for reinforcement as in Conventional Examples 1 and 2. Therefore, it is possible to reduce the heat capacity of the temperature sensor 200, and as a result, good thermal responsiveness is obtained.

In Present Invention 6, the total thickness of the temperature sensor 200 was 0.19 mm, and the thermal time constant was 0.2 seconds. This result indicates that the total thickness can be further reduced while the strength is secured using the FPC substrate as the lead 18 in Present Invention 6. Therefore, the temperature sensor 200 can be formed to have a small thermal capacity, and as a result, better thermal responsiveness is obtained.

In the above-described electronic component 10 for welding, the case in which the electrode film 13 and the function part 14 are separately formed has been exemplified. However, for example, as in the case of the electronic component 10 for welding shown in FIG. 15 and FIG. 16, the electrode film 13 and the function part 14 may be integrally formed. The electronic component 10 for welding having such a configuration is suitable for the temperature sensor 200, and the electrode film 13 and the function part 14 are formed of a metal material such as platinum.

Figure 17:
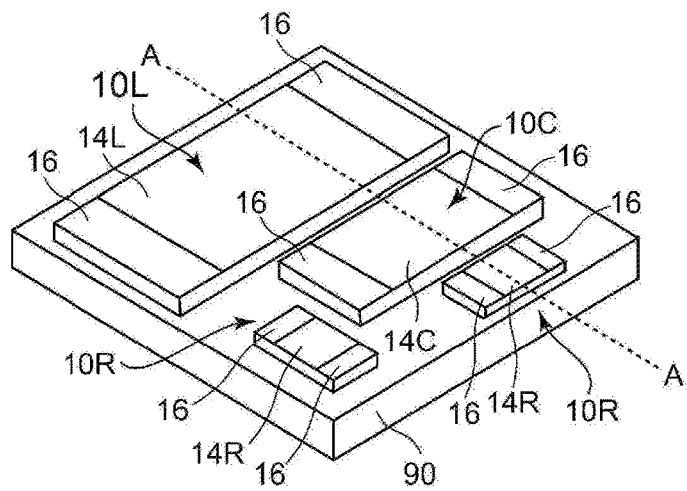
FIG. 17 is a perspective view showing an example in which an electronic component for welding including a resistor, a capacitor, and an inductor is mounted.
Figure 18:
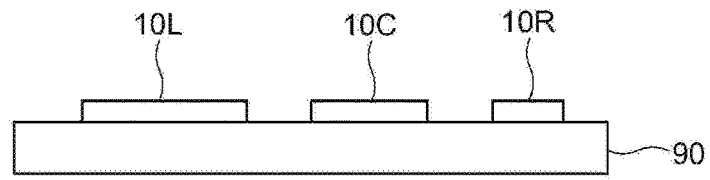
FIG. 18 is a cross-sectional view taken along line A-A of FIG. 17.

In the above-described embodiment, as the electronic component 10 for welding according to the present invention, the case in which the electronic component 10 (10R) for welding including the resistance part having a predetermined resistance value as the function part 14 is mounted in a board has been exemplified. However, a passive element such as a capacitor 10C and an inductor 10L can also be configured as the electronic component 10 for welding based on the same idea. In this case, as shown in FIGS. 17 and 18, the electronic component 10R for welding having the resistance part, the capacitor 10C, and the inductor 10L respectively include function parts 14R, 14C, and 14L serving as a resistance part, a capacitance part and an inductance part, and the bonding electrode parts 16 are provided to sandwich them. As shown in FIGS. 17 and 18, such an electronic component for welding is welded and mounted on a mounted board 90 in a predetermined layout, so that a circuit board having a high mounting density can be constructed.

Subsequently, characteristic configurations and operational effects of the electronic component 10 for welding and the temperature sensor 200 in the above-described embodiment are as follows.

In the electronic component for welding described in claim 1, since the insulating substrate in which the thickness of the bonding electrode part can be reduced is not thermally damaged by having the above-described configuration, improvement of the tensile strength can be efficiently realized, and reliability is improved. Further, in the case in which the electronic component for welding is built in the board, the complicated wiring process can be simplified, and wiring and electrical bonding in a printed board can be performed only by the welding process.

Furthermore, there is an effect that high heat resistance can be obtained by welding the bonding part of the bonding electrode part. Since solder or the like is not used in the wiring of the printed circuit board, a heat resistant temperature can be set to 200° C. or more.

Since the electronic component for welding described in claim 2 has at least one function of a resistor, a capacitor, and an inductor as the function part, passive elements thereof can be realized. Additionally, various electric circuits can be constructed on a board with a high density layout by combining these electronic components for welding.

Since the electronic component for welding described in claim 3 further includes an electrode film (a conductive part) formed to be interposed between the function part and the bonding electrode part, a step of forming or processing the bonding electrode part can be independent from a step (for example, a heat treatment step) around the bonding electrode part, and a degree of freedom in fabrication and processing and stability of characteristics and functions in the bonding electrode part can be improved.

In the electronic component for welding described in claim 4, the electrode film is formed on a film, under a film, or in a film of the function part formed in a film shape. Therefore, the above-described configuration can be efficiently constructed with various layouts.

In the electronic component for welding described in claim 5, since the total thickness of the bonding electrode part is 1 µm or less, the thickness of the bonding part can be reduced. This makes high density mounting possible.

In the electronic component for welding described in claim 6, a thin insulating substrate having a thickness of 100 µm or less can be used by using an insulating substrate having a substrate bending strength of 690 MPa or more. This makes high density mounting possible. When a thin insulating substrate having a thickness of 100 µm or less and a substrate bending strength of 690 MPa or less is used, there is a problem that the insulating substrate may be broken during a manufacturing process and during use.

In the electronic component for welding described in claim 7, since the melting point of the high melting point metal is 1300° C. or more and the melting point of the low melting point metal is lower than 1300° C., damage to the insulating substrate during the welding process can be reduced.

In the electronic component for welding described in claim 8, since the melting point of the high melting point metal is 1400° C. or more, damage to the insulating substrate during the welding process can be further reduced.

In the electronic component for welding described in claim 9, since a material including at least one of titanium, chromium, zirconium, tungsten, molybdenum, manganese, cobalt, nickel, and tantalum as a component is used as a material of the active metal layer, it is possible to maintain firm bonding with a ceramic substrate.

In the electronic component for welding described in claim 10, since a material including at least one of platinum, vanadium, hafnium, rhodium, ruthenium, rhenium, tungsten, molybdenum, and tantalum, which are high melting point materials, as a component is used as a material of the barrier layer, the barrier layer is prevented from melting during the welding process.

In the electronic component for welding described in claim 11, since a material including at least one of gold, silver, and copper as a main component is used as a material of the bonding layer of the low melting point metal, welding can be realized easily by melt bonding and diffusion bonding.

In the mounted board described in claim 12, since the electronic component for welding described in any one of claims 1 to 11 is welded to the mounted board, a bonding material such as solder or the like becomes unnecessary, and the heat resistant temperature can be improved.

Since the mounted board described in claim 13 is a multilayer board with a built-in component, electrical connection can be achieved only by the welding process, and mounting can be realized with high reliability and high density.

Since the mounted board described in claim 14 is a flexible board, a very thin mounted board can be realized.

The temperature sensor described in claim 15 is formed by bonding the leads to the pair of bonding electrode parts of the above-described electronic component of welding. In such a temperature sensor, the function part serves as a heat sensing film by utilizing a characteristic that a resistance value in the function part changes on the basis of temperature. Since the lead uses a low melting point metal as a main component, the thermal responsiveness is improved by reducing a thickness of the welding part, and since thermal damage to the insulating substrate is not given, the improvement of the tensile strength is efficiently realized and reliability is improved, and since an additional glass reinforcing material is not used, there is a feature that the thickness of the temperature sensor becomes thin and responsiveness can be improved.

In the temperature sensor described in claim 16, since the welding is a melt welding, a strong bonding strength can be obtained.

In the temperature sensor described in claim 17, since the welding is diffusion bonding, there is an effect that a bonding part can be thinned because the bonding part does not protrude. This improves response performance.

In the temperature sensor described in claim 18, since the lead is in the form of a thin plate or a foil, the thickness of the bonding part can be made thin, and thus response performance is improved.

In the temperature sensor described in claim 19, since the lead includes copper as a main component, it is possible to form the bonding part with respect to the bonding electrode part without giving the thermal damage to the insulating substrate.

In the temperature sensor described in claim 20, since a material which is any one of phosphor bronze, beryllium copper, brass, white copper, nickel silver, constantan, a copper silver alloy, a copper iron alloy, a copper gold alloy is used as the material of the lead, the effect of efficiently diffusing heat and reducing the damage to the insulating substrate can be further enhanced.

In the temperature sensor described in claim 21, since the lead is bonded to the bonding layer via the welding part and the bonded part of the lead is exposed to the outside, it is possible to obtain a thin structure which does not have a reinforcing material such as glass or the like.

In the temperature sensor described in claim 22, since the lead is an insulating coated lead wire, it is possible to further improve the tensile strength.

In the above-described embodiment, a laser was used for lead bonding as a specific method of fusion welding, pressure welding or brazing. However, for example, a parallel gap type resistance welding method, a high temperature exothermic heater chip or a pulse heat method may also be used as a bonding method other than the laser. In particular, the method using the heater chip is suitable for obtaining the bonding mode of FIG. 8.

The invention claimed is:

1. An electronic component for welding, comprising:
   an insulating substrate;
   a function part formed on the insulating substrate;
   a protective part formed on the function part;
   at least a pair of bonding electrode parts electrically connected to the function part,
   wherein the bonding electrode part includes at least an active layer formed on the insulating substrate and including a high melting point metal as a main component, a barrier layer formed on the active layer and including a high melting point metal as a main component, and a bonding layer formed on the barrier layer and including a low melting point metal as a main component; and
   an electrode film formed on and in physical contact with the insulating substrate and interposed between the function part and the bonding electrode part, wherein the function part is indirectly connected to the bonding electrode part through the electrode film.

2. The electronic component for welding according to claim 1, wherein the function part has at least one function of a resistor, a capacitor, and an inductor.

3. The electronic component for welding according to claim 1, wherein the electrode film is formed on a film, under a film, or in a film of the function part formed in a film shape.

4. The electronic component for welding according to claim 1, wherein a thickness of the bonding electrode part is 1 μm or less.

5. The electronic component for welding according to claim 1, wherein a bending strength of the insulating substrate is 690 MPa or more, and a thickness thereof is 100 μm or less.

6. The electronic component for welding according to claim 1, wherein a melting point of the high melting point metal of the active layer and the barrier layer is 1300° C. or more, and a melting point of the low melting point metal is lower than 1300° C.

7. The electronic component for welding according to claim 6, wherein the melting point of the high melting point metal of the active layer and the barrier layer is 1400° C. or more.

8. The electronic component for welding according to claim 1, wherein the active layer includes at least one of titanium, chromium, zirconium, tungsten, molybdenum, manganese, cobalt, nickel, and tantalum as the main component.

9. The electronic component for welding according to claim 1, wherein the barrier layer includes at least one of platinum, vanadium, hafnium, rhodium, ruthenium, rhenium, tungsten, molybdenum, nickel, and tantalum as the main component.

10. The electronic component for welding according to claim 1, wherein the low melting point metal includes at least one of gold, silver, and copper as the main component.

11. A mounted board in which the electronic component for welding according to claim 1 is mounted by welding.

12. The mounted board according to claim 11, wherein the mounted board is a multilayer board with a built-in component.

13. The mounted board according to claim 11, wherein the mounted board is a flexible board.

14. A temperature sensor comprising:
   the electronic component for welding according to claim 1; and
   a lead bonded to the pair of bonding electrode parts,
   wherein the function part is configured as a heat sensing film of which a function value varies on the basis of temperature, and the lead includes a low melting point metal as a main component.

15. The temperature sensor according to claim 14, wherein a fusing part of the lead and a melting part of the bonding layer are melt-bonded.

16. The temperature sensor according to claim 14, wherein the lead and the bonding layer are diffusion-bonded.

17. The temperature sensor according to claim 14, wherein the lead is formed in a thin plate shape or a foil shape.

18. The temperature sensor according to claim 14, wherein the lead includes copper as the main component.

19. The temperature sensor according to claim 14, wherein the lead includes any one of phosphor bronze, beryllium copper, brass, white copper, nickel silver, constantan, a copper silver alloy, a copper iron alloy, and a copper gold alloy.

20. The temperature sensor according to claim 14, wherein the lead is bonded to the bonding layer via a welding part of the bonding layer, and a bonded part of the lead is exposed to the outside.

21. The temperature sensor according to claim 14, wherein the lead is an insulating coated lead wire.

* * * * *